(12) United States Patent
Biro et al.

(10) Patent No.: US 8,916,415 B2
(45) Date of Patent: Dec. 23, 2014

(54) METHOD AND DEVICE FOR PRODUCING A METALLIC CONTACT STRUCTURE FOR MAKING ELECTRICAL CONTACT WITH A PHOTOVOLTAIC SOLAR CELL

(75) Inventors: Daniel Biro, Freiburg (DE); Jan Specht, Freiburg (DE); Daniel Scheffler, Freiburg (DE); Maximilian Pospischil, Freiburg (DE); Florian Clement, Freiburg (DE)

(73) Assignee: Fraunhofer-Gesellschaft zur Förderung der Angewandten Forschung E.V., München (DE)

( * ) Notice: Subject to any disclaimer, the term of this patent is extended or adjusted under 35 U.S.C. 154(b) by 0 days.

(21) Appl. No.: 13/819,849

(22) PCT Filed: Aug. 29, 2011

(86) PCT No.: PCT/EP2011/004323
§ 371 (c)(1),
(2), (4) Date: May 10, 2013

(87) PCT Pub. No.: WO2012/028289
PCT Pub. Date: Mar. 8, 2012

(65) Prior Publication Data
US 2013/0224906 A1    Aug. 29, 2013

(30) Foreign Application Priority Data
Sep. 3, 2010  (DE) .................... 10 2010 044 349

(51) Int. Cl.
| | |
|---|---|
| *H01L 21/00* | (2006.01) |
| *H01L 31/00* | (2006.01) |
| *H01L 21/67* | (2006.01) |
| *H05K 3/12* | (2006.01) |
| *H01L 31/0224* | (2006.01) |
| *H05K 1/09* | (2006.01) |

(52) U.S. Cl.
CPC .... *H01L 31/022425* (2013.01); *H01L 21/6715* (2013.01); *H05K 3/1241* (2013.01); *H05K 1/092* (2013.01); *H05K 2203/0134* (2013.01); *Y02E 10/50* (2013.01)
USPC ............................................ 438/98; 136/256

(58) Field of Classification Search
USPC ............................................ 438/98; 136/256
See application file for complete search history.

(56) References Cited

U.S. PATENT DOCUMENTS

| | | |
|---|---|---|
| 5,151,377 A | 9/1992 | Hanoka et al. |
| 5,776,545 A * | 7/1998 | Yoshiba et al. ............ 427/64 |

(Continued)

FOREIGN PATENT DOCUMENTS

EP   1787785   5/2007

*Primary Examiner* — Karen Kusumakar
(74) *Attorney, Agent, or Firm* — Volpe and Koenig, P.C.

(57) ABSTRACT

A method for producing a metallic contact structure for making electrical contact with a photovoltaic solar cell, wherein, in order to create the contact structure, a paste, which contains metal particles, is applied to a surface of a carrier substrate via at least one dispensing opening, wherein the dispensing opening and the carrier substrate are moved in relation to one another during the dispensing of the paste. The paste is circulated in a circulating region, and in each case a part of the paste is branched off out of the circulating region at a plurality of branching points and each branching point is assigned at least one dispensing opening, via which the paste branched off at the branching point is applied to the surface of the carrier substrate, wherein the paste flows through a flow path having a length of less than 1 cm in each case between being branched off out of the circulating region and being dispensed from the dispensing opening assigned to the branching point. A device for producing a metallic contact structure for making electrical contact with a photovoltaic solar cell is also provided.

20 Claims, 11 Drawing Sheets

(56) References Cited

U.S. PATENT DOCUMENTS

| | | |
|---|---|---|
| 5,951,350 A * | 9/1999 | Aoki et al. ............ 445/24 |
| 6,857,925 B2 * | 2/2005 | Miyashita et al. ............ 445/24 |
| 8,561,571 B2 * | 10/2013 | Shioi et al. ............ 118/686 |
| 2002/0009536 A1 * | 1/2002 | Iguchi et al. ............ 427/10 |
| 2005/0223917 A1 * | 10/2005 | Bang et al. ............ 101/123 |
| 2007/0169806 A1 | 7/2007 | Fork et al. |

* cited by examiner

1a

1b

2a

2b

2c

3a

3b

4a

4b

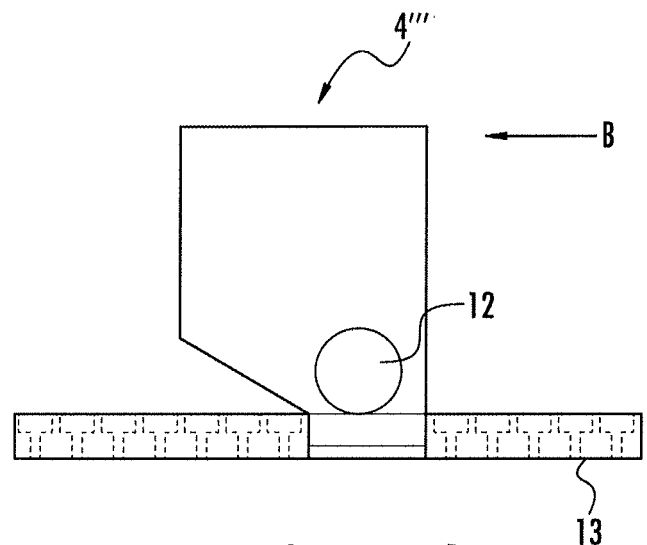
FIG. 9A
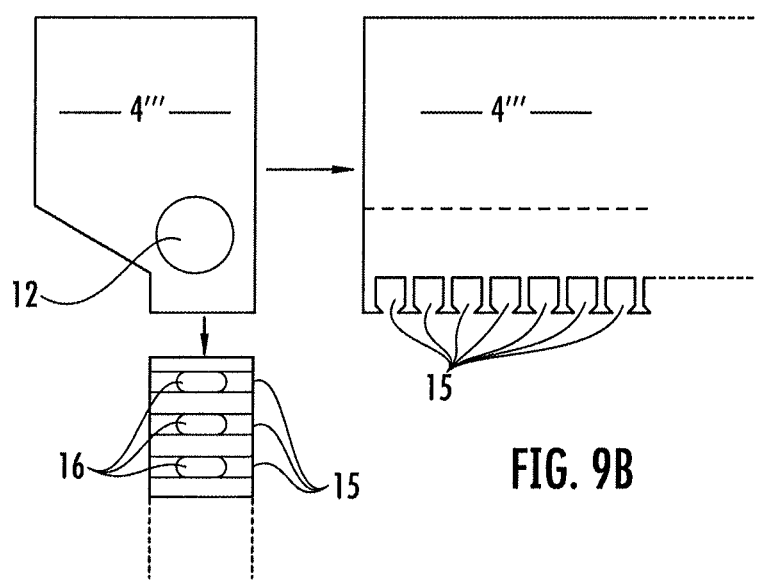
FIG. 9B
FIG. 9C

METHOD AND DEVICE FOR PRODUCING A METALLIC CONTACT STRUCTURE FOR MAKING ELECTRICAL CONTACT WITH A PHOTOVOLTAIC SOLAR CELL

BACKGROUND

The method relates to a device and a method for producing a metallic contact structure for electrically contacting a photovoltaic solar cell.

A photovoltaic solar cell represents a planar semiconductor element, in which via incident electromagnetic radiation a separation of charge carriers is generated, so that a potential develops between at least two electric contacts of the solar cell and electric power can be tapped from the solar cell by an external circuit connected thereto via contacts.

Here, the charge carriers are collected via metallic contact structures so that by contacting these contact structures at one or more contact sites the charge carriers can be supplied to the external circuit. Typically, here metallic contact structures are applied on a surface of the solar cell during the production of said solar cell, frequently in a grid-like or double-comb shape, with the contact structures covering the surface of the solar cell like fingers so that the charge carriers are collected from all sections of the solar cell in a planar fashion by the contact structure and can be fed from there to an external circuit.

When the contact structures are applied on a surface of the solar cell, where electromagnetic radiation shall impinge the solar cell, the contact structures must fulfill competing requirements: The contact structure shall cover a surface area of the solar cell as small as possible in order to minimize any loss from shadowing. Furthermore, in order to avoid electric loss the metallic contact structure shall exhibit a low contact resistance to the contacted semiconductor section of the solar cell, and on the other hand, the resistivity inside the contact structure shall be low.

Accordingly it is advantageous for the contacting structure arranged on the solar cell to exhibit an aspect ratio as high as possible, i.e. a high ratio of the height in reference to the width of the contact structure. This contact structure is embodied very small in this case so that low shadowing is achieved. Simultaneously the contact structure is embodied very high so that the cross-sectional area is large, accordingly the electrically resistivity perpendicular in reference to the cross-sectional area is low, and thus the charge carriers can be transported with little loss.

For the production of such contact structures it is known to apply the entire contact structure completely in a single step via serigraphy using a silver-containing paste. However, here wide contact structures develop, i.e. contact structures with a low aspect ratio, resulting in low conductivity and, due to their width, also in relatively high optic loss by shadowing the underlying semiconductor material of the solar cell.

Furthermore, it is known from U.S. Pat. No. 5,151,377 to generate a contact structure by a dispenser applying a paste, which comprises metal particles, via a dispensing opening onto a semiconductor substrate, with during the discharge the semiconductor substrate is moved in reference to the dispensing opening.

For the industrial production it is essential that the entire production process of the solar cell, particularly also the production of the contact structure, can be performed flawlessly and cost-effectively, without the effectiveness of the solar cell being considerably compromised by the production method selected.

SUMMARY

The present invention is therefore based on the objective to provide a method and a device for producing a metallic contact structure for the electric contacting of a photovoltaic solar cell, which can be implemented on an industrial level and particularly shows low susceptibility to errors and/or low failure rates in reference to methods and devices of prior art. Furthermore, via the method according to the invention and the device according to the invention it should be possible to produce contact structures with a higher aspect ratio compared to conventional serigraphy methods.

This objective is attained in a method for the production of a metallic contact structure for the electric contacting of a photovoltaic solar cell as well as by a respective corresponding device having one or more features of the invention. Advantageous further developments of the method according to the invention and advantageous further developments of the device according to the invention are discernible below and in the claims.

In the methods according to the invention for producing a metallic contact structure for the electric contacting of a photovoltaic solar cell a paste comprising metallic particles is applied via at least one dispensing opening onto the surface of a carrier substrate to generate a contacting structure. Here, the dispensing opening and the carrier substrate are moved in reference to each other. Thus, due to the relative motion a paste trail develops on the carrier substrate from which the contact structure is created.

It is essential that the paste is rotated in a circulating region and a portion of the paste is separated from the circulating region at each of the plurality of branching points. Each branching point is here allocated to at least one dispensing opening, via which the paste separated at the branching point is applied to the surface of the carrier substrate. Furthermore, the paste flows along a flow path respectively from the circulating region between the branching point and the discharge from the dispensing opening allocated to the branching point, with its length being less than 5 cm.

Accordingly, contrary to methods of the prior art, a rotation of the paste occurs in a circulating region and only a portion of the paste is separated from the circulating region at a plurality of branching points and discharged via at least one dispensing opening each. Consequently the paste is in constant motion, on the one hand in the circulating region or when flowing through the branch off to the dispensing opening. This is based on the acknowledgement of the applicant that a constant movement of the paste prevents precipitations and particularly clogging of the dispensing openings. Thus, by the method according to the invention the susceptibility to malfunction, particularly due to precipitations and clogging, is considerably reduced in reference to methods of prior art. Here, it is additionally essential according to the acknowledgement of the applicant that only a small amount of the paste is moved outside the circulating region. This is ensured in the method according to the invention such that the length of the flow path, starting from the branching point to the dispensing opening allocated to said branching point, is less than 5 cm.

When applying the method according to the invention, by the plurality of branching points simultaneously several paste trails can be generated parallel in reference to each other on the carrier substrate so that a fast and thus industrially cost-effectively implemented production of the metallic contact structure occurs. Furthermore it is possible to select the relative motion between the dispensing openings and the carrier substrate and/or to arrange the dispensing openings such that subsequently two or more paste trails can be applied over top of each other on the carrier substrate, so that additionally a higher aspect ratio (height to width) of the produced paste trail can be yielded, and thus a contact structure is generated advantageous for solar cells, as described at the outset.

The device according to the invention for the production of a metallic contacting structure to electrically contact a photovoltaic solar cell comprises at least one discharge flow path with a dispensing opening for a paste, which comprises metallic particles, and at least one pumping means for discharging the paste via the discharge flow path at the dispensing opening onto the surface of a carrier substrate. Via the pumping means here the paste can be discharged via the discharge flow path from the dispensing opening onto the surface of the carrier substrate.

It is essential that the device according to the invention comprises a circulating region and that pumping means are embodied cooperating with the circulating region such that the paste can be rotated in the circulating region via the pumping means. The circulating region shows a plurality of branching points, each of which respectively connected in a fluid-conducting fashion via at least one discharge flow path to a dispensing opening such that at the branching points each a portion of the paste can be separated from the circulating region and can be applied via the dispensing openings on the carrier substrate. Furthermore, the length of the flow path of the paste, starting at the branching point via the discharge flow path to the dispensing opening, is less than 5 cm each.

Thus it is discernible that the above-mentioned advantages with regards to the method according to the invention also appear in the device according to the invention, because the paste can be rotated in the circulating region and thus error caused by precipitation or clogs are minimized as well as due to the fact that the above-mentioned length of the flow path between the branching point and the dispensing opening is less than 5 cm. For a further reduction of the risk of clogging the length of the flow path between the branching point and the dispensing opening is preferably less than 1 cm, further preferred less than 0.7 cm, preferably less than 0.3 cm, further preferred less than 0.05 cm, particularly less than 0.03 cm. Accordingly the above-mentioned length of the flow path is selected as mentioned above in the method according to the invention.

It is therefore essential for the invention that rotation of the paste occurs in the circulating region and paste is separated from the circulating region via the plurality of branching points and discharged via the respective dispensing opening. Here, it is within the scope of the invention that the rotation occurs in the circulating region in a small volume, such as for example by stirring via an agitator. The scope of the invention also includes that the rotation occurs by a movement of the paste back and forth in the circulating region, particularly by an oscillating paste movement. In a preferred embodiment the paste is moved via pumping means, preferably in an oscillating fashion at least in the area of the plurality of branching points. This can be implemented for example in a preferred embodiment in which pumping means are provided at one or at both ends of the circulating region moving the paste back and forth in the circulating region.

In another preferred embodiment the rotation occurs in the circulating region by rotating the paste in a rotation circuit. Here the advantage results that other elements, such as a container serving as the paste reservoir, can be included easily in the rotation circuit using fluid technology.

The scope of the invention also includes combining both types of movements, which means to provide a rotation circuit in which constantly or temporarily an oscillating back and forth movement of the paste occurs by the pumping means, at least in the circulating region in the proximity of the plurality of the branching points.

The device according to the invention and the method according to the invention are suitable for using arbitrary pastes, particularly also low-viscosity pastes. The use of printing paste comprising metallic particles is particularly advantageous.

In the method according to the invention advantageously the paste is discharged at all dispensing openings with an appropriately identical volume flow. This way it is achieved that the paste paths applied simultaneously from the different dispensing openings to the carrier substrate have identical volumes, i.e. particularly the same width and height perpendicular in reference to the direction of motion so that a uniform contact structure is produced, which can be reproduced with a high level of precision.

Advantageously, in the method according to the invention in the circulating region and/or upstream in reference to the first branching point the volume flow is greater by at least a factor of 5, preferably by at least a factor of 10, preferably at least by a factor of 50, further preferred by at least a factor of 100, in particular by at least a factor of 1000 than the total of volume flows of all dispensing openings. This way it is ensured that a considerably greater portion of paste is rotated in the circulating region and only a smaller portion in reference thereto is separated via the branching points and discharged by the dispensing openings. This way, at all times a large amount of paste is rotated and the conditions for rotating the paste can essentially be predetermined by the volume flow in the circulating region and here almost independent from the (quantity of) paste removed. This way, an environmental condition can be predetermined by the rotation conditions, preventing any adhesion of the paste.

Advantageously, in the method according to the invention, in all sections of the circulating region in which a branching point is located for discharging paste via a dispensing opening, a pressure is given of at least 3 bar, preferably at least 5 bar, further preferred at least 10 bar, particularly at least 20 bar, further preferred at least 30 bar above the ambient pressure. This way, it is ensured that any potential pressure differences in the circulating region due to the removal of paste at the branching points only leads to a relatively minor pressure change in the circulating region and thus approximately constant conditions are given at all branching points and a homogenous volume flow can be achieved at all dispensing openings.

In particular it is advantageous that the pressure of the paste at the branching points differs by less than 5%, preferably by less than 1%, preferably by less than 0.5%. This minor difference of the pressure of the paste at the various branching points also ensures the discharge of the paste with an approximately homogenous volume flow at all dispensing openings.

Preferably, in the method according to the invention at least in one partial section of the flow path of the circulating region paste is separated via several branching points located behind each other in the direction of flow of the paste and, starting from each branching point, fed to a dispensing opening allocated to one of these branching points. This way, the multiple separation and discharge of paste from the circulating region is possible in a simple fashion. Accordingly, the device according to the invention is advantageously embodied such that at least in a part of the circulating region several branching points are arranged, located behind each other in the direction of flow of the paste, each of which conducting fluid and here connected via at least one discharge flow path to at least one dispensing opening. This way, in a simply designed fashion the multiple branching points and the discharge of paste is realized via the dispensing openings.

In order to achieve the discharge of the paste at the dispensing openings located behind each other in the direction of flow in the circulating region with approximately constant volume flow in the method according to the invention, with branching points located in the circulating region behind each other in the direction of flow of the paste the overall reduction of pressure from the first branching point to the last branching point, seen in the direction of flow, is lower preferably by at least a factor of 10, preferably at least a factor of 50, particularly at least a factor of 100 than the average pressure reduction between the branching point and the dispensing opening allocated to said branching point. Due to the considerably higher pressure reduction in this advantageous embodiment between the branching point and the dispensing opening in reference to the pressure reduction between the individual branching points there are approximately homogenous conditions at each branching point so that a discharge of paste with a homogenous volume flow can be easily realized at each dispensing opening.

The device according to the invention is advantageously embodied such that in the plurality of branching points located behind each other in the circulating region in the direction of flow of the paste, between the first and the last branching point in the direction of flow in the circulating region the minimum cross-sectional area of the circulating region is greater by at least a factor of 5, preferably at least a factor of 10, preferably at least by a factor of 50, further preferred by at least a factor of 100, particularly at least by a factor of 1000 than the minimum cross-sectional area of all flow paths between a branching point and the dispensing opening allocated to said branching point. This way it is ensured that the rotation volume is considerably greater than the separated volume of the paste and in a simple fashion a low pressure reduction is realized in the circulating region between the first and the last branching point in the direction of flow so that the discharge of paste is possible with an approximately homogenous volume flow at all dispensing openings.

The dispensing openings advantageously show a diameter of the opening of less than 200 µm, preferably less than 150 µm, further preferred less than 100 µm, in particularly preferably less than 80 µm, further preferred less than 50 µm, particularly preferred less than 30 µm. This way a precise discharge of paste onto the carrier substrate is possible. In particular, the device according to the invention is preferably embodied such that at each dispensing opening in the flow path between the branching point from the circulating region and the dispensing opening the diameter of the line is less than 200 µm, preferably less than 150 µm, further preferred less than 100 µm, particularly preferably less than 80 µm, further preferred less than 50 µm, particularly preferred less than 30 µm. This way the advantage results that the paste exits the device without any additional shearing, in a targeted fashion, and laminar through the opening and this way allows a homogenous application of the contact fingers on the substrate.

In order to compensate any still existing pressure difference in the circulating region between the branching points located behind each other in the direction of flow the device according to the invention is advantageously embodied such that for branching points located behind each other in the direction of flow in the circulating region the length of the flow path of the paste between the branching point and the discharge from the dispensing opening allocated to the branching point reduces in the direction of flow of the circulating region. This way, due to the length to be flown through shortening the flow resistance reduces for the paste between the branching point and the allocated dispensing opening from the first branching point to the last one, seen in the direction of flow in the circulating region, so that a pressure reduction at the branching points is compensated. Additionally or alternatively it is advantageous for the minimal cross-sectional opening between the branching point from the circulating region and the discharge via the dispensing opening to increase in the direction of flow in the circulating region. This way, too, the resistance of flow for the paste is reduced between the branching point and the dispensing opening, starting from the first branching point, in the direction of flow of the circulating region, to the last branching point in the direction of flow in the circulating region and thus compensates any potential pressure reduction. Preferably the lengths of the flow paths and/or the cross-sections are selected such that paste can be discharged with approximately the same volume flow at all dispensing openings. Any change of the cross-sections of all dispensing openings however leads to a change of the linear width of the applied paste trails so that preferably the cross-sections are constant and only the length or the flow path is embodied reducing in the direction of flow, as described.

When the flow paths between the branching points from the circulating region and the dispensing opening show different cross-sections they are advantageously embodied such that the narrowest cross-section is present at the dispensing opening. This way it is prevented that paste already in the flow path separates from the duct walls and can discharge from the dispensing opening in an unaligned fashion. Alternatively of additionally, preferably the flow path is embodied as a conical nozzle towards each dispensing opening. This results in the advantage that the friction in the nozzles is considerably lower and thus the operating pressure of the device can be reduced.

Preferably, in the device according to the invention, with the circulating region being embodied as a rotation circuit, the pumping means is arranged upstream in reference to the plurality of the branching points, and downstream in reference to the last branching point in the direction of flow a throttle is arranged to increase the flow resistance of the paste. This way, in a simple fashion between the pumping means and the throttle, i.e. at all branching points, an increased pressure is realized in the rotation circuit, while downstream in reference to the throttle a lower pressure in reference thereto is possible up to the reentry of the paste into the pump in the rotation circuit, for example approximately equivalent to the ambient pressure. This way, on the one hand, a simply constructed design develops, in particular a reservoir, open towards the environment, is arranged between the throttle and the pumping means, downstream in reference to the throttle, so that on the one side in a simple fashion paste can be provided in large quantities in the rotation circuit and on the other side the reservoir open to the environmental pressure can easily be refilled, even during processing. Preferably the throttle is embodied as an adjustable throttle, so that the user can control the pressure between the pumping means and the throttle by adjusting the flow resistance of the throttle.

An adjustable throttle further has the advantage that the adjustment of the optimal parameters for the discharge of the paste (pressure, volume flow, etc.) can be controlled more precisely and in a targeted fashion by regulating the pumping capacity and the throttle effect. Preferably, in the device according to the invention, in the area of the rotating circuit, a pressure measuring device is provided above the dispensing opening, in order to measure the pressure of the paste. The pressure measuring device is preferably embodied such that the paste pressure is transferred via the fluid impermeable membrane to a liquid medium, and a pressure measuring device is arranged in the liquid medium. This way, any adhesion of the paste at the pressure measuring device is prevented.

Preferably, the device according to the invention comprises at least two pumping means, with a first pumping means being arranged in the circulating region upstream in reference to the first branching point to the dispensing opening and a second pumping means downstream in reference to the last branching point to a dispensing opening in the circulating region. Both pumping means are preferably embodied as adjustable pumping means. By selecting the flow rate the two pumping means, in this preferred embodiment the amount of paste discharged via the dispensing opening can be controlled: When the flow rate of the second pumping means is selected lower than the one of the first, the second pumping means act as a type of throttle so that pressure develops between the first and the second pumping means, and by increasing said pressure, i.e. increasing the difference between the flow rate of the two pumping means, increased paste discharge can be achieved at the dispensing openings and/or by a respective reduction the discharge of paste can be reduced. Furthermore, the second pumping means is advantageous such that the conveyance of the paste in the circulating region near the branching points towards the paste reservoirs shows a lower susceptibility to malfunction due to the second pumping means. Preferably the device according to the invention has both a second pumping means, as described above, as well as a throttle, as described above; this way a very precise control of the pressure reduction and/or the amount of paste discharged at the dispensing openings as well as the flow rates in the circulating region is possible.

Preferably the device according to the invention in the circulating region comprises at least one flow meter to measure the flow rate and/or amount of paste flown through. This way, a control of the rotation process is possible, particularly a review or, via a control unit and corresponding control of the pump, an adjustment of the predetermined flow rate in the rotation section. In particular it is advantageous to provide one flow meter each in the circulating region upstream in reference to the first branching point and downstream in reference to the last branching point to a dispensing opening. This way, from the difference of the two flow rates measured the amount of discharged paste can be determined and particularly the discharged amount can be adjusted to a predetermined value via the control unit and corresponding adjustment of the pump and/or a controllable throttle and/or another pump.

Preferably, in the device according to the invention, no pumping means are interposed in the circulating region in the direction of flow between the first and the second branching point. This way any potential pressure change caused by the pumping means is avoided, which could lead to different flow rates at the dispensing openings.

Advantageously, in the device according to the invention the circulating region is realized, at least in the section of the branching points, as a hollow body with several branching points embodied as openings in the hollow body. This way, in a simply constructed fashion and thus producible in a cost-effective fashion several branching points and every branching off respectively allocated to a dispensing opening is arranged behind each other in the direction of flow of the paste in the rotation section. In particular, it is advantageous that the openings are embodied like nozzles. This way, the nozzle forms known from prior art for applying paste can be easily integrated, for example in order to generate advantageous aspect ratios of the paste trails on the carrier substrate.

A cost-effective embodiment of the device according to the invention develops when the above-mentioned hollow body tapers in the circulating region downstream in reference to the last branching point so that by this cross-sectional tapering a throttle effect is given. When embodying the device according to the invention with a controllable throttle as described above, such a tapering may be provided additionally, advantageously in this case the throttling may exclusively be ensured by the controllable throttle in order to ensure high variability. The cross-sectional area of the hollow body, at least in the area of the branching points, preferably amounts to at least $0.3$ mm$^2$, preferably at least $1$ mm$^2$, further preferred at least $1.8$ mm$^2$, further preferred at least $2.8$ mm$^2$, further preferred at least $6$ mm$^2$, in order to ensure low flow resistance in the circulating region and a sufficient amount of paste in the rotation section.

In another preferred embodiment of the method according to the invention the paste in the circulating region is rotated at least in a section via a branching point and downstream in reference to the branching point in several parallel flow paths, with in each of the parallel flow paths at least at a branching point a part of the paste is separated and discharged via at least one dispensing opening allocated to the branching point. This is particularly advantageous in order to cause additional shearing and thus a better mixing and liquefaction of the paste.

In order to further minimize the susceptibility to malfunction due to precipitation of the paste in the circulating region or clogging the device according to the invention comprises, at least in the section of the branching points, advantageously one or more oscillation devices, which are arranged at the circulating region to cause the paste to oscillate. By the oscillations the risk of precipitations of clogging is further reduced. In particular, it is advantageous to embody the oscillation device as an ultrasound generator in order to impinge the paste with ultrasound.

Preferably, in the device according to the invention a heating device is arranged in the circulating region so that via the heating unit a thermal input into the rotated paste can be achieved. This way the rotated paste can be heated in order to lower the viscosity of the paste. In particular, it is advantageous to provide one or more heating units at and/or in the area of the dispensing openings so that the paste can be impinged with heat, at least at the dispensing openings, advantageously in the flow path between the branching points and the dispensing openings so that by way of heating and thus lowering the viscosity additionally the risk of clogging is reduced, particularly in the critical area between the branching point and the dispensing opening.

Typically, via the method according to the invention and/or the device according to the invention the application of the paste occurs on a semiconductor substrate for producing a photovoltaic solar cell. Additionally it is within the scope of the invention that the carrier substrate is embodied in order to accept several solar cells, for example in a modular switching. Via the method according to the invention and/or the device according to the invention it is therefore also covered by the scope of the invention to generate a contact structure on a carrier substrate which is a part of a module for accepting several photovoltaic solar cells.

Advantageously, in the method according to the invention the carrier substrate is moved underneath locally fixed dispensing openings. This way, particularly a simple integration is possible of the method according to the invention in an inline-process. However, it is also within the scope of the invention to move the dispensing openings over a locally fixed carrier substrate or to combine both types of movement. In particular the combination of both types of movement offers additional benefits:

For example, the carrier substrate can be moved underneath the dispensing openings in order to generate several paste trails arranged parallel side-by-side, from which finger-like contact structures are formed. At some places additionally a movement of the dispensing opening can occur, advantageously perpendicular in reference to the direction of motion of the carrier substrate, for example in order to generate paste trails perpendicular in reference to the above-mentioned paste trails and stacked repeatedly over top of each other, from which metallic lateral lines form with a high cross-section, so-called "bus bars". In the above-mentioned fashion here the comb-like or double-comb like contacting pattern can be generated, typical for solar cells.

The distance between the dispensing opening and the substrate is preferably less than 5 cm, preferably less than 3 cm, further preferred less than 1 cm, particularly less than 0.5 cm. This way it is ensured that the paste strand between the dispensing opening and the carrier substrate is not torn off and thus a continuous paste trail is generated on the carrier substrate.

Examinations of the applicant have shown that certain flow rates are advantageous, i.e. relative speeds between the dispensing opening and the carrier substrate. This is caused in the fact that, when a minimum value is maintained as the relative speed between the carrier substrate and the dispensing opening, additionally an extension of the applied paste strand occurs due to the higher speed of the dispensing opening so that thinner paste strands can be achieved in reference to the lower relative speeds, and especially when several paste strands are applied over top of each other higher aspect ratios can be yielded. The examinations of the applicant have shown that preferably the relative speeds between the dispensing opening and the carrier substrate ($V_{rel}$) exit with a speed greater preferably by a factor of 1.4, preferably at least by a factor of 2, further preferred at least by a factor of 5 than the speed ($V_p$), at which the paste strand exits the dispensing opening.

An optimization is achieved when the speed ratio $V_{rel}/V_p$ is selected depending on the diameter of the dispensing opening:

| Opening diameter of the dispensing opening in the range of | Factor $V_{rel}/V_p$ at least | Preferably at least | Particularly at least |
|---|---|---|---|
| 30 µm to 80 µm, preferably 50 µm to 60 µm | 1 | 1.2 | 1.4 |
| 50 µm to 100 µm, preferably 70 µm to 80 µm | 1.2 | 1.4 | 1.6 |
| 80 µm to 150 µm, preferably 110 µm to 120 µm | 2 | 2.2 | 2.4 |
| 100 µm to 200 µm, preferably 140 µm to 160 µm | 3 | 4 | 5 |

In order to define the start and the end of a paste trail on the carrier substrate the device according to the invention comprises preferably means for interrupting the discharge of the paste from the dispensing openings. Preferably the means are embodied such that the discharge of paste from one or more dispensing openings can be optionally predetermined.

Advantageously the above-mentioned interruption means are embodied as valve-like shutters arranged at a dispensing opening or in the flow area between the branching point and a dispensing opening.

Additionally, the scope of the invention includes to provide the pumping means with a control unit and to embody it adjustable such that the pressure generated by the pumping means can be optionally predetermined at the branching points, so that by slowing down the pumping means or shutting them off particularly the pressure at the branching points can be reduced and thus the discharge of paste to the dispensing openings can be switched off.

In another preferred embodiment of the device according to the invention a suctioning and/or blowing device is arranged in the area of the dispensing openings such that the emitted paste trails can each be suctioned and/or blown away via the suctioning and/or blowing device so that a targeted interruption of the application of the paste trails on the carrier substrate can be achieved by suctioning or blowing off.

In another preferred embodiment of the device according to the invention the dispensing openings are arranged in an articulate fashion so that the dispensing openings can optionally be moved away or pivoted away from the carrier substrate such that by this moving away and/or pivoting away of the dispensing openings an interruption of the application of paste trails on the carrier substrate can be achieved.

Preferably the paste shows a maximum particle diameter, which is at least smaller than the minimum cross-sectional area in the entire flow path of the paste by a factor of 4, preferably at least by a factor of 7, further preferred at least by a factor of 10. This way the risk of clogging is further reduced.

Preferably, in the device according to the invention a particle filter is arranged in the circulating region, preferably downstream in reference to the pump between the pump and the dispensing openings. The particle filter is preferably embodied such that only those particles can penetrate the filter with their particle diameter being smaller than the minimum diameter in the flow path of the paste by a factor of 4, preferably by a factor of 7, further preferred by a factor of 10. This way the risk of clogging is further reduced.

In the method according to the invention and/or the device according to the invention metal-containing pastes can be used for producing a contact structure, known for the production of solar cells, particularly pastes comprising metal particles used for serigraphy. In particular the use of commercial serigraphy pastes is advantageous.

By using several rotating circuits it is also possible with the method according to the invention and the device according to the invention to sequentially apply different media on the substrate, i.e. pastes with different components, particularly by pressure means serially arranged in the direction of transportation of the carrier substrate, each of which show a circulating region and several dispensing openings each.

Preferably, in the device according to the invention a bypass is provided, so that optionally a rotation of the paste via the bypass can occur, circumventing the dispensing openings. A rotation via the bypass is particularly advantageous in order to achieve at the start of the printing process a liquefaction of the paste by an initial rotation via the bypass and/or in order to allow interrupting the discharge via the dispensing openings by circumventing the dispensing openings using the bypass.

In the device according to the invention it is particularly advantageous that the pressure means comprises exchangeable elements, which exchangeable elements comprise at least one branching point with a respective fluid line mouthing in a dispensing opening. This way it is possible in a simple fashion to exchange the dispensing openings and corresponding fluid lines to the branching points, which are preferably embodied as nozzles. This way, for example in the event of clogged nozzles, corrections can be made quickly by exchanging the entire above-mentioned element. In particular a motorized system may be provided in order to perform such an exchange in an automatic fashion.

This motorized system can be particularly embodied such that the exchangeable element is moved during the dispensing process in the feeding direction of the overall device. By this relative motion a different feeding speed can be achieved for each individual nozzle. Here, the connection to the branching point is to be embodied such that during the motion there is a constant contact to the fluid line. This is advantageous because in this way potential differences in the volume flow of the individual dispensing openings can be compensated.

For example, the scope of the invention includes providing a nozzle bar with a plurality of bore holes, which can be displaced linearly via a motorized element in reference to the pressure means. This way, in a simple fashion a clogged nozzle can be replaced by displacing the nozzle bar to the position of the next bore hole. Additionally it is possible to achieve an interruption of the paste flow, by displacement from a position with a bore hole to a position without a bore hole, so that a closure of the respective paste discharge path occurs.

BRIEF DESCRIPTION OF THE DRAWINGS

Additional preferred features and embodiments are discernible based on the figures and the description of these figures. Shown here are:

FIG. 9 in the details a, b, and c another exemplary embodiment of an alternative embodiment of a pressure means, and FIG. 10 a nozzle platelet in the detail a and a nozzle bar in the detail b for the use with the pressure means according to FIG. 9.

DETAILED DESCRIPTION OF THE PREFERRED EMBODIMENTS

Exemplary embodiments are shown in the FIGS. 1a and 1b, in which the circulating region is respectively embodied as a rotation circuit.

Figure 1:
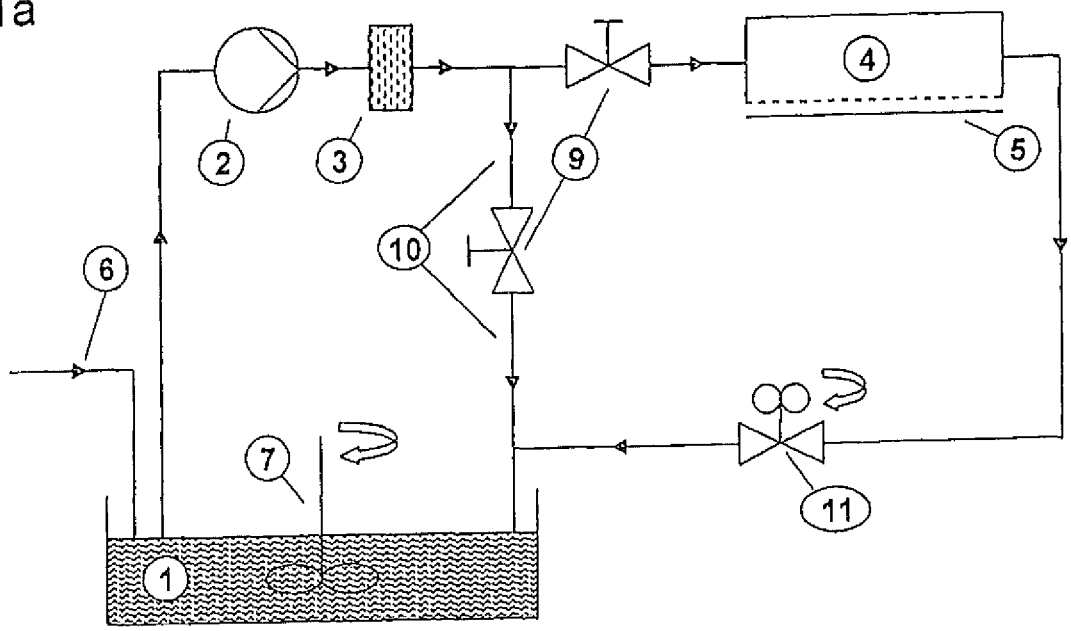
FIG. 1a an exemplary embodiment of a device according to the invention for the production of a metallic contact structure to electrically contacting a photovoltaic solar cell.
FIG. 1b a second exemplary embodiment of a device according to the invention for the production of a metallic contact structure to electrically contact a photovoltaic solar cell comprising two pumping means.
Figure 1:
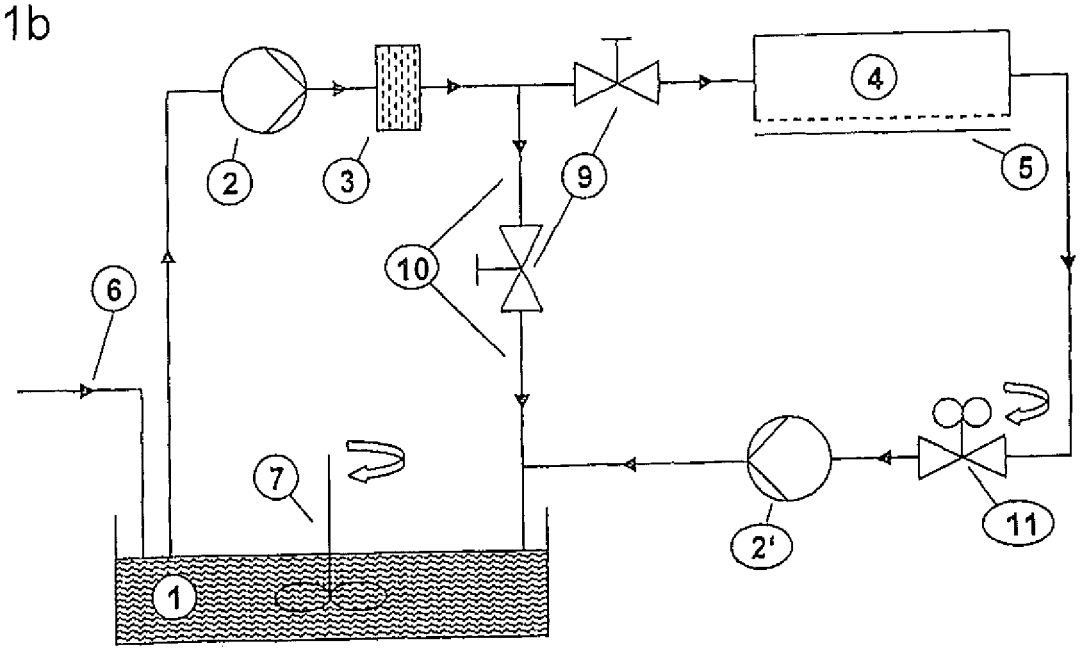

FIG. 1a shows schematically the basic design of a first exemplary embodiment of a device according to the invention for the production of a metallic contact structure for electrically contacting a photovoltaic solar cell. Starting at a paste reservoir 1, paste is pumped via a pumping means 2, embodied as a pump, through a particle filter 3 into a pressure means 4. A portion of the paste is separated at the pressure means 4 at a plurality of branching points and via dispensing openings, respectively allocated to the branching points, applied on a carrier substrate 5. The carrier substrate 5 represents a precursor of a solar cell to be produced from a silicon wafer, with on the side, shown at the top in FIG. 1, a metallic contact structure shall be applied.

Starting at the pressure means, the paste flows via an additional line back into the paste reservoir 1. The paste reservoir 1 is refilled via a refill line 6 when the fill level falls short of a predetermined minimum value.

As discernible in FIG. 1a, in the exemplary embodiment the paste present in the device according to the invention is in constant circulation: Starting from the paste reservoir 1, the paste is circulated via the pressure means and therefrom further downstream back to the paste reservoir. Additionally, an agitator 7 is applied in the paste reservoir, which additionally leads to a local circulation within the paste reservoir.

The pressure means 4 is embodied such that the rotating circuit at the outlet side of the pressure means is embodied as a throttle by way of a constriction of the cross-section. The pump 2 is embodied such that at the pressure side of the pump 2 a paste pressure is given of approximately 35 bar. This paste pressure increases only to a minor extent between the outlet side of the pump 2 via the particle filter 3 to the throttle unit at the outlet side of the pressure means 4 (by less than 1 bar). Downstream in reference to the pressure means, however, in the return to the paste reservoir, a paste pressure is given only slightly above the ambient pressure. In the paste reservoir 1 approximately ambient pressure is given.

The particle filter 3 is embodied in order to filter out undesired particles with their diameter exceeding 25% of the minimum cross-section in the overall paste circuit (including the dispensing openings) so that any clogging of the dispensing openings of the pressure means is avoided.

The device according to FIG. 1a further comprises two valves 9 as well as a bypass line 10. By opening a first valve 9 and closing a second valve 9 or vice versa the paste flows in the rotation circuit optionally through the pressure means 4 or through the bypass line 10. This way, an interruption of the application of paste trails onto the carrier substrate 5 is possible by switching the rotation circuit via the bypass line 10, circumventing the pressure means 4.

Furthermore, in the rotation circuit, downstream in reference to the pressure means 4, a controllable throttle 11 is arranged so that on the one hand via the flow rate of the pump 2 and on the other hand via the control of the throttle effect of the throttle 11 the pressure in the rotation circuit can be adjusted, particularly between the pump 2 and the throttle 11 as well as in the pressure means 4.

FIG. 1b shows schematically the basic structure of a second exemplary embodiment of a device according to the invention for the production of a metallic contact structure for electrically contacting a photovoltaic solar cell. The second exemplary embodiment is equivalent with regards to design and function to the exemplary embodiment shown in FIG. 1a, with additionally here a second pump 2' being arranged in the rotation circuit downstream in reference to the throttle 11. This way, on the one hand additionally the pressure reduction in the pressure means 4 can be controlled by selecting different flow rates between the pump 2 and the pump 2', and furthermore there is a reduced risk of clogging, particularly of the pipelines between the pressure means 4, downstream thereat via the throttle 11 [and the] pump 2' to the reservoir 1, due to the additional feeding by the pump 2'.

Figure 2:
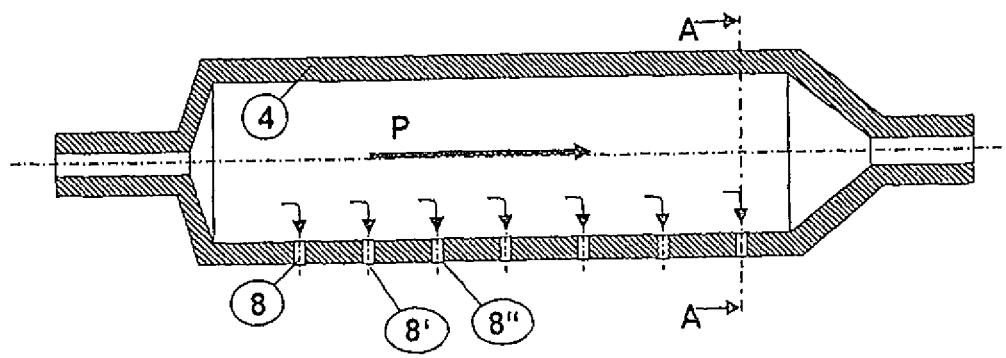
FIG. 2a a cross-section along the direction of flow of the paste through a first exemplary embodiment of a pressure means 4 according to FIG. 1.
FIGS. 2b and 2c each a cross-section along the direction of flow of the paste through a second and a third exemplary embodiment (4' and 4") of a pressure means according to FIG. 1.
Figure 2:
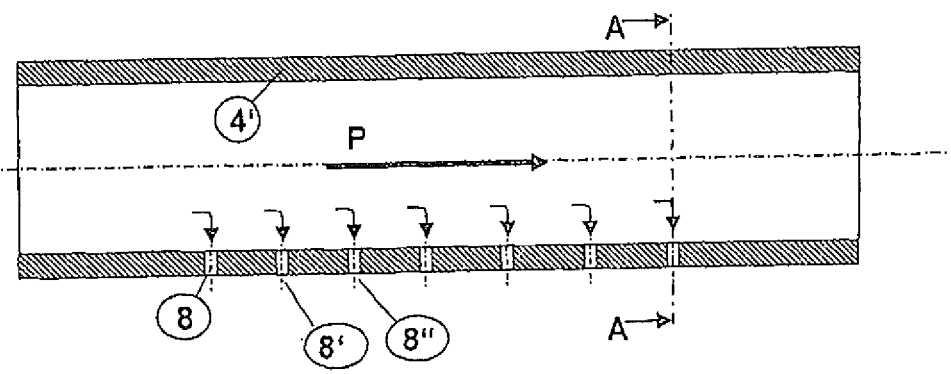
Figure 2:
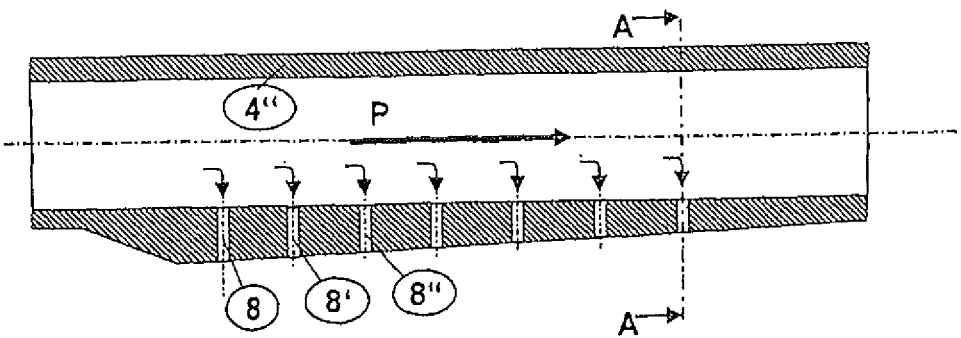

FIG. 2a shows a cross-section parallel in reference to the direction of flow of the paste in the rotation circuit of the pressure means 4. The direction of flow of the paste in the rotation circuit extends from the left towards the right. The pressure means 4 is embodied as a hollow body, which shows several openings at the bottom, with two of them being marked as examples with the reference characters 8' and 8". The openings 8', 8" are embodied as penetrations of the external wall of the pressure means 4. At the upper side of the openings 8', 8" in FIG. 2, a portion of the paste is respectively separated from the rotation circuit, flows through the openings, and is discharged to the end of the openings located at the bottom in FIG. 2, and this way several paste trails are applied on the carrier substrate 5. In the upper section the openings therefore represent branching points for taking a portion of the paste from the rotation circuit, comprise in the lower section respective dispensing openings for discharging the paste, and between the branching point and the dispensing opening the openings serve as dispensing flow paths between the branching point and the dispensing opening.

The cross-sectional area of the pressure means 4 in the area of the openings amounts to approx. 30 mm$^2$. Downstream in reference to the last opening the pressure means 4 shows a cross-sectional constriction in the area A towards a cross-sectional area at the outlet side of the pressure means 4 of 6 mm$^2$. This cross-sectional constriction in the area A acts as a throttle for the paste in the rotation circuit so that the above-mentioned pressure ratios develop.

The openings 8', 8" of the pressure means 4 are embodied cylindrical with a cross-sectional area of 0.018 mm$^2$. Due to the considerably larger cross-sectional area of the pressure means 4 in the rotation circuit of the paste, compared to the cross-sectional areas of the openings 8', 8", the pressure reduction amounts to only 0.015 bar, from the first opening 8' to the last opening, seen in the direction of flow of the plate in the rotation circuit. At the upper sections of the openings 8', 8", i.e. at the branching points, therefore an approximately constant pressure is given, so that this way already an approximately constant volume flow is ensured at the dispensing openings of the pressure means 4. In order to compensate the above-mentioned low pressure difference, additionally the lower conversion of the pressure means 4 is embodied, with regards to the wall thickness, seen in the direction of flow of the paste in the rotation circuit, from the first opening 8' reducing towards the last opening, seen in the direction of flow of the paste in the rotation circuit. This way, a continuously reducing length of the openings develops. Openings with greater length and accordingly longer flow paths between the branching point and the dispensing opening therefore show a slightly increased flow-through resistance for the paste so that the above-mentioned pressure reduction is additionally compensated by the flow-through resistance reducing with shortened length of the opening. This way, a homogenous volume flow is achieved very precisely in all dispensing openings for the paste dispensed.

FIG. 2b shows a second exemplary embodiment of a pressure means 4' in a cross-section parallel in reference to the direction of flow of the paste in the rotation circuit. In this exemplary embodiment the pressure means shows no enlargement at the inlet and/or tapering of the diameter at the outlet, but it is embodied with the diameter of the tubular thickness of the rotation circuit.

FIG. 2c shows a third exemplary embodiment of a pressure means 4, also in a cross-section, parallel in the direction of flow of the paste in the rotation circuit. In this exemplary embodiment the thickness of the conversion is embodied reducing in the area of the openings 8', 8", 8''' in the direction of flow of the paste so that the flow path of the paste reduces from the branching point of the rotation circuit to the dispensing opening, i.e. the flow path at the opening 8 is greater than at the opening 8' and this in turn greater than at the opening 8''', etc. By the reducing flow path the flow resistance is also reduced and thus the pressure reduction in the pressure means 4 is compensated over the rotation circuit.

Figure 3:
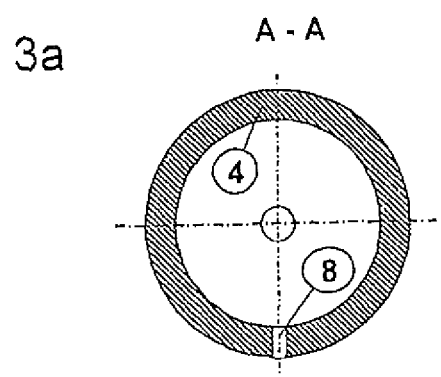
FIG. 3a a cross-section of the pressure means according to FIG. 2a along the line A perpendicular in reference to the direction of flow of the paste.
FIGS. 3b, 4a, and 4b cross-sections each along the line A through alternative exemplary embodiments of the pressure means perpendicular in reference to the direction of flow of the paste.
Figure 3:
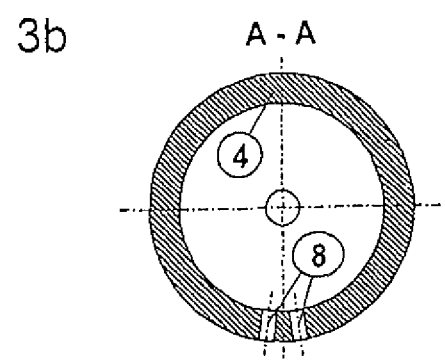

FIG. 3a shows a cross-section perpendicular in reference to the drawing level in FIG. 2, along the line A. The pressure means 4 is embodied as a hollow cylinder, with at least in the area of the openings 8', 8" the wall thickness of the hollow cylinder, as described above, is embodied reducing in the direction of flow of the paste in the rotation circuit.

FIGS. 3b, 4a, and 4b show alternative embodiments of pressure means each in a cross-section perpendicular in reference to the drawing level in FIG. 2 along the line A. In the exemplary embodiment according to FIG. 3b, in the circumferential direction of the pressure means, two openings each are arranged, so that not only in the direction of the rotation circuit simultaneously several paste trails are applied, but additionally also perpendicular in reference to the circulating direction two paste trails each are applied simultaneously, for example in order to generate two paste trails located over top of each other in order to increase the aspect ratio.

FIGS. 4a and 4b illustrate exemplary embodiments similar to FIGS. 3a and 3b, with the pressure means showing a rectangular cross-section. When embodying the pressure means 4 with a rectangular cross-section a bottom plate, which comprises openings 8, can be exchanged in a simple fashion in order to quickly make corrections, for example in case of clogging, and/or select different arrangements for various fields of application, a different number and/or a different size of openings by using an appropriate bottom plate.

Figure 4:
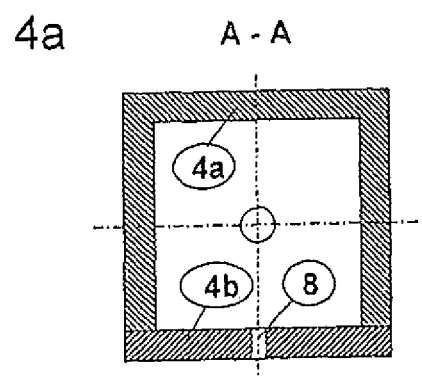
Figure 4:
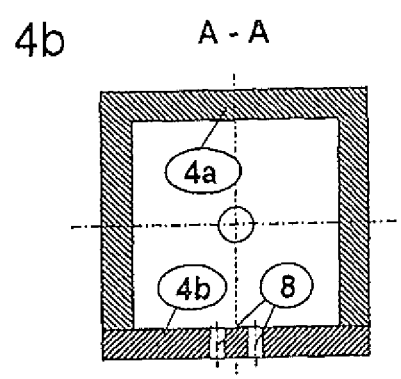

FIG. 4 shows an alternative embodiment of a pressure means 4. The pressure means 4 is embodied box-shaped, comprising a u-shaped element, which is closed by a bottom plate 4b. Openings 8 are formed in the bottom plate 4b. In this embodiment, by exchanging the base plate an adjustment of the design of the openings 8 can be implemented in a simple fashion, for example to different viscosities of the paste.

Figure 5:
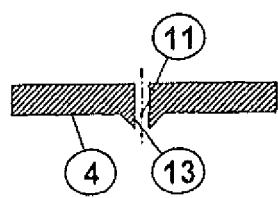
FIG. 5 a partial cross-section of an alternative embodiment of a pressure means parallel in reference to the direction of flow of the paste, in which the dispensing openings are embodied as nozzles.

FIG. 5 shows another exemplary embodiment of a pressure means 4, with only a detail of a cross-section in the area of the opening 8' being shown. The opening 8' is embodied like a nozzle at the exterior of the pressure means 4. This way, nozzle geometries of prior art can be integrated in a simple fashion in the device according to the invention in order to generate particular geometries of the paste trails and this way further increase the aspect ratio of the paste trails generated.

Figure 6:
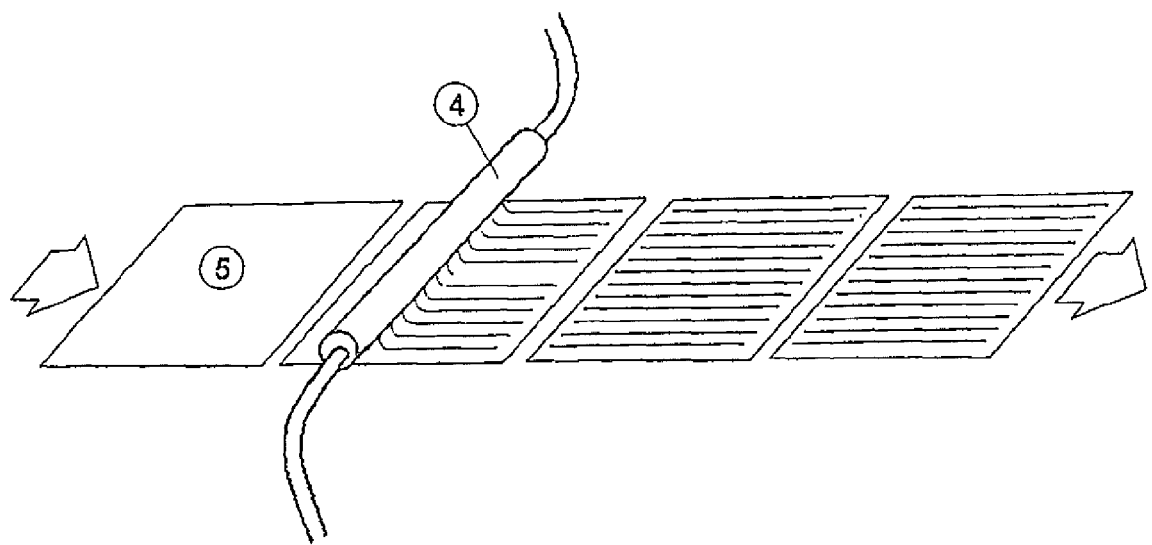
FIG. 6 a perspective illustration of the pressure means according to FIG. 2 and several carrier substrates.

FIG. 6 shows a perspective illustration of the pressure means 4 and several carrier substrates 5 during the production of the metallic contact structure. The carrier substrates 5 are moved underneath the locally fixed pressure means 4 according to the direction D. This way, via the openings 8', 8''' of the pressure means 4 several parallel paste trails are generated on the carrier substrate 5, from which the finger-like metallic contact structures, known per se, are formed on the carrier substrate 5.

Figure 7:
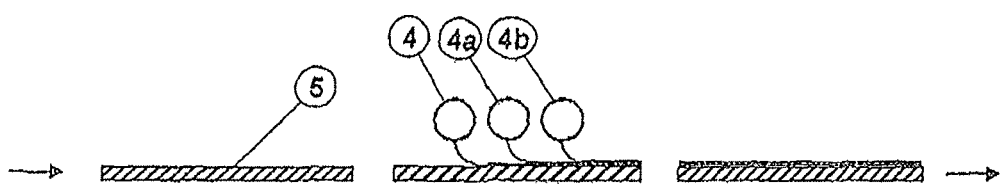
FIG. 7 another exemplary embodiment of a device according to the invention n which several pressure means are arranged parallel in reference to each other.

FIG. 7 shows another exemplary embodiment of a device according to the invention, in which several pressure means 4, 4a, 4b are arranged parallel in reference to each other. The carrier substrates 5 are moved according to the direction D and the openings of the pressure means 4, 4a, and 4b are arranged such that paste trails are created positioned over top of each other. Thus, three paste trails are created, located over top of each other on the carrier substrate 5, so that an additional increase of the aspect ratio is achieved.

Figure 8A:
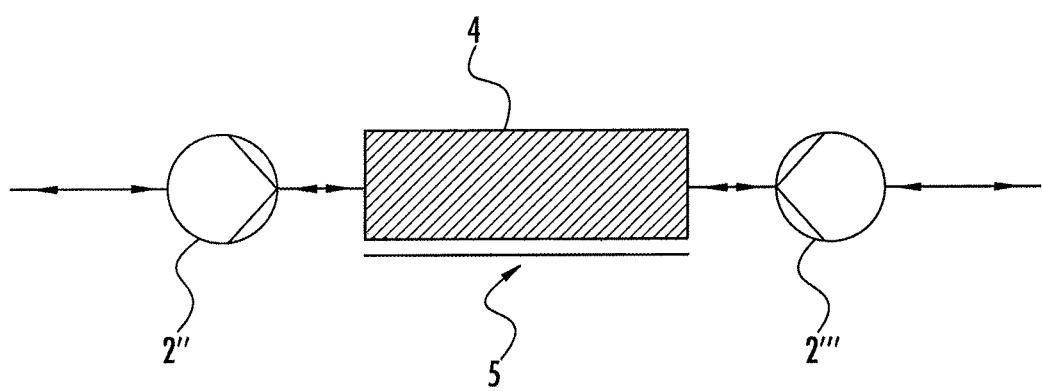
FIG. 8a another exemplary embodiment of a device according to the invention which is suitable for performing an oscillating movement of the paste in a circulating region.

FIG. 8a shows another exemplary embodiment of the device according to the invention in a schematic detail. Here, one pumping means 2'' and 2''' is respectively allocated to each outlet of the pressure means 4. Via this pumping means the paste is moved back and forth in an oscillating fashion in the pressure means 4, as marked by the arrows in FIG. 8.

This way, a constant movement of the paste and thus a shearing stress upon the paste is also achieved, which leads to an advantageous, simpler processing of the paste.

In this exemplary embodiment it is therefore not necessary to form a closed circuit because the circulation occurs in this case by a linear oscillating motion of the paste. Preferably containers are provided at the outlets of the pumping means 2'' and 2''', each at the side facing away from the pressure means 4, to collect and/or refill the paste.

Figure 8B:
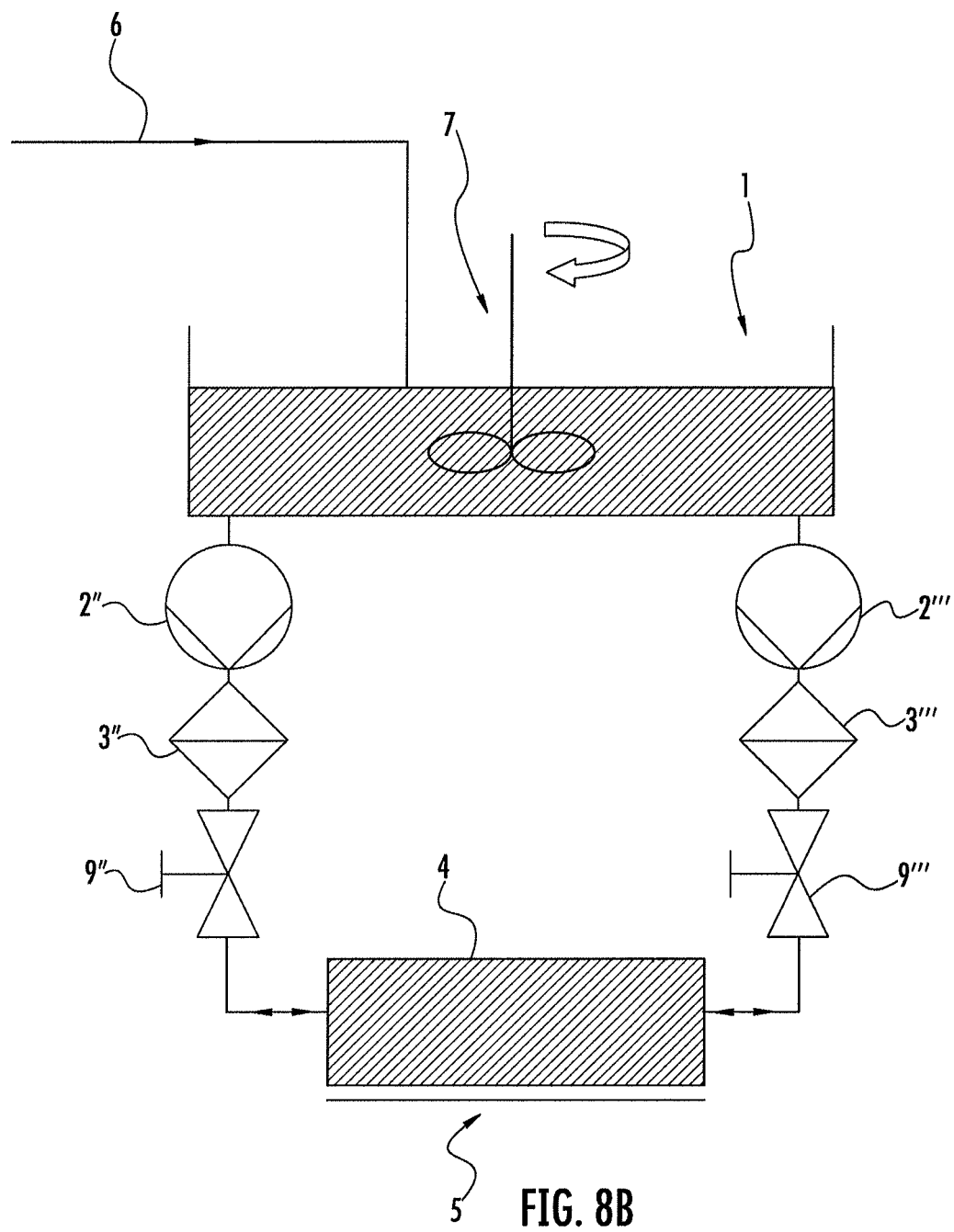
FIG. 8b another exemplary embodiment of a device according to the invention, which allows both the rotation of the paste in an oscillating motion as well as in a rotating circuit.

FIG. 8b shows another exemplary embodiment of the device according to the invention which comprises a refill line 6, a paste reservoir 1 with an agitator 7, pressure means 4, as well as pumping means 2'' and 2'''. The two above-mentioned pumping means are on the one side connected in a fluid conducting fashion to the paste reservoir 1 and on the other side via filters 3'' and 3''' as well as via valves 9'' and 9''' in a fluid conducting fashion to the pressure means 4.

In this exemplary embodiment it is therefore possible to achieve an oscillating movement of the paste back and forth in the pressure means 4. Additionally it is possible by the concordant pumping of the paste via the pumping means 2'' and 2''' to convey the paste in the rotation circuit. Potentially developing particle collections can be dissolved by reversing the circulation circuit.

FIG. 9 shows another alternative exemplary embodiment of a pressure means 4'''.

FIG. 9a shows the pressure means 4''' in a cross-section perpendicular in reference to the direction of flow of the paste, with the cylindrical tubular paste line 12 being connected via a displaceable nozzle bar 13 to a respective branching point and a dispensing opening in said nozzle bar 13 in a fluid-conducting fashion. A detail b of the nozzle line 13 is shown in a perspective in FIG. 10. Here, a plurality of openings is visible, which open in branching points, each of which opens at the bottom of the nozzle bar 13, not shown, in a dispensing opening.

Using a motorized displacement means, not shown, the nozzle bar 13 in FIG. 9a can be shifted horizontally, as indicated by the arrow.

This way it is possible to provide a new nozzle, i.e. a new branching point with a dispensing opening, in a simple fashion and particularly also in an automated fashion by a simple linear shifting of the nozzle bar when a nozzle is clogged. This way, the maintenance expense of the device according to the invention is considerably reduced and in particular it is possible to yield low downtimes caused by clogged nozzles.

In the illustrated details b and c of FIG. 9 other views of the pressure means 4''' are shown:

FIG. 9b shows a side view parallel in reference to the direction of flow of the paste in the tubular paste line 12, i.e. a view according to arrow B in FIG. 9a and perpendicular in reference to the drawing level in FIG. 9a. Here, particularly at the bottom of the pressure means 4''', receivers 15 are discernible in which for example one nozzle bar 13 each can be inserted according to FIG. 10b, with the direction of displacement in FIG. 9b being perpendicular in reference to the drawing level. The receivers 15 are complementary to the cross-sectional shape of the nozzle bars to be accepted therein, so that the nozzle bars can be arranged in the receivers in a form-fitting fashion.

FIG. 9c shows as a detail a view of the bottom of the pressure means 4'''. Here, openings of the pressure means 4''' 16 are each discernible in the receivers 15, from which during operation paste is dispensed and passes through the respective openings in the nozzle bar through the respective nozzle bar in order to reach the carrier substrate (not shown).

Figure 10A:
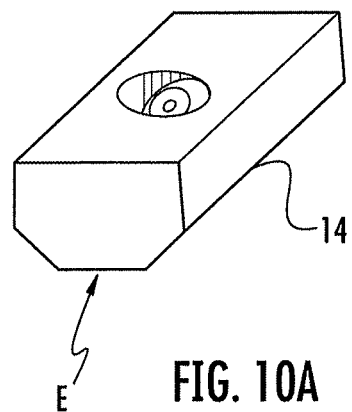
Figure 10A:
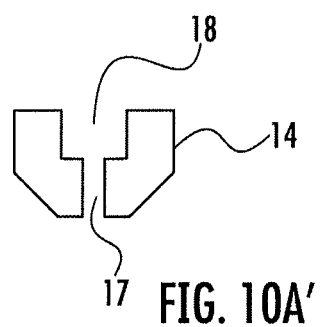
Figure 10B:
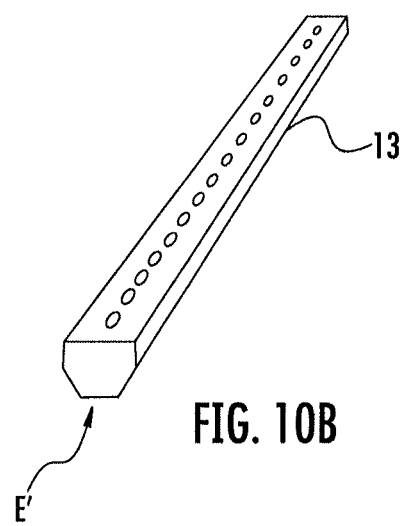

As an alternative to the use of nozzle bars 13 here nozzle platelets 14 may be used according to FIG. 10a.

These nozzle platelets only show one opening and are exchanged if necessary, for example when an opening is clogged. Here, advantageously an automatic dispenser, comprising a magazine with a plurality of nozzle platelets 14, is arranged at the pressure means 4''' so that optionally a nozzle platelet can be exchange, which is located in a predetermined receiver 15, by way of inserting a new nozzle platelet 14 using the dispenser.

The nozzle platelets 14 and/or the nozzle bar 13 may be produced from different materials, preferred materials are ceramics, silicon, or steel.

As particularly discernible in FIGS. 9a and 9b, the nozzle platelets 14 and/or the nozzle bar 13 represent the lowest point of the pressure means 4''' when arranged in the receiver 15. This is ensured in that the end (reference character E in FIG. 10a and E' in FIG. 10b) of the nozzle platelet 14 and/or the nozzle bar 13 pointing downwards is embodied such that it projects downwards after being inserted into the receiver 15. This is illustrated in the exemplary embodiment shown in FIGS. 10a and 10b by the nozzle platelet 14 and the nozzle bar 13 showing a dovetail shape in its cross-section.

Preferably the nozzle platelets 14 or the different openings of the nozzle bar 13 vary with regards to the length of the nozzle channel:

In FIG. 10a', as an example, a cross-section through the nozzle platelet 14 perpendicular in reference to the longitudinal extension of the nozzle platelet is shown, centrally in reference to the opening in the nozzle platelet. In the lower section a nozzle channel 17 is provided which shows the optimal length and the optimal diameter for the desired dosing behavior of the paste. In the upper section a supply channel 18 is provided which bridges the remaining height of the nozzle platelet 14 and furthermore shows a considerably larger diameter compared to the nozzle channel 17, preferably at least twice, preferably at least tenfold the diameter of the nozzle channel 17. The supply channel 18 and the nozzle channel 17 are each embodied cylindrical.

This way it is possible to provide nozzle channels with different lengths and different diameters at a constant height of the nozzle platelet 14, so that the dosing behavior can be varied by a selection of different lengths and diameters of the nozzle channel 17.

Of course, it is also possible to embody different openings according to the cross-sectional illustration 10a' at the nozzle bar 13 and particularly to vary the length and diameter of the respective nozzle channel between the individual openings of the nozzle bar. This way when using the nozzle bar 13 the dosing behavior can be influenced by displacing said nozzle bar.

An exchange between two nozzle platelets 14 or two different openings of the nozzle bar 13 occurs preferably simultaneously with the exchange of the carrier substrate to be processed.

Preferably clogged nozzle platelets 14 are cleaned and reused.

The invention claimed is:

1. A method for producing a metallic contact structure for electrically contacting a photovoltaic solar cell, comprising for generation of the contact structure applying a paste comprising metal particles via dispensing openings onto a surface of a carrier substrate, moving the dispensing openings and the carrier substrate in reference to each other during discharge of the paste, rotating the paste in a circulation region, respectively separating a portion of the paste at a plurality of branching points from the circulation region and each of the branching points is allocated to at least one of the dispensing openings, and applying the paste separated at the branching point on a surface of the carrier substrate, with the paste respectively flowing through a flow path with a length of less than 5 cm between the branching point out of the circulating region and a discharge point of the dispensing opening allocated to said branching point, wherein the rotation in the circulating region occurs by a movement back and forth in the circulating region.

2. A method for producing a metallic contact structure for electrically contacting a photovoltaic solar cell, comprising for generation of the contact structure applying a paste comprising metal particles via dispensing openings onto a surface of a carrier substrate, moving the dispensing openings and the carrier substrate in reference to each other during discharge of the paste, rotating the paste in a circulation region, respectively separating a portion of the paste at a plurality of branching points from the circulation region and each of the branching points is allocated to at least one of the dispensing openings, and applying the paste separated at the branching point on a surface of the carrier substrate, with the paste respectively flowing through a flow path with a length of less than 5 cm between the branching point out of the circulating region and a discharge point of the dispensing opening allocated to said branching point, wherein the rotation in the circulating region occurs by circulating the paste in a rotation circuit.

3. A method according to claim 1, wherein the paste is dispensed at all of the dispensing openings with approximately identical volume flow.

4. A method according to claim 1, wherein a volume flow of the paste in the circulating region upstream in reference to a first one of the branching points is greater than a total of the volume flows of all of the discharge openings by at least a factor of 5.

5. A method according to claim 1, wherein in all partial sections of the circulating region in which the branching points are located to dispense the paste via one of the dispensing openings, a pressure of the paste is at least 3 bar above ambient pressure.

6. A method according to claim 1, wherein a pressure of the paste at each of the branching points differs by less than 5%.

7. A method according to claim 1, wherein in at least a section of the flow path of the circulating region, the paste is taken via the branching points which are located behind each other in a direction of flow of the paste and, starting at each of the branching points, is fed to one of the dispensing openings allocated to at least one of the branching points.

8. A method according to claim 7, wherein in the branching points, located behind each other in the direction of flow of the paste in the circulating region, a reduction in pressure from the first one of the branching points in the direction of flow to a last one of the branching points in the direction of flow is lower by at least a factor of 10 than a mean pressure reduction between the branching point and the dispensing opening allocated to said branching point.

9. A method according to claim 1, wherein in the circulating region the paste is circulated at least in a section above one of the branching points, and downstream in reference to the one of the branching points there are several parallel flow paths of the circulating region, with each of the parallel flow paths having at least a different one of the branching points a portion of the paste is separated and discharged via at least one of the dispensing openings allocated to each of the branching points.

10. A device for the production of a metallic contact structure for electrically contacting a photovoltaic solar cell, comprising dispensing flow paths with dispensing openings for a paste comprising metallic particles and at least one pump (2) to discharge the paste via the dispensing flow paths to the dispensing openings onto a surface of a carrier substrate, the pump cooperates with a circulating region such that the paste can be rotated in the circulating region via the pump, with the circulating region comprising a plurality of branching points, each of said branching points being connected in a fluid-conducting fashion via at least one of the dispensing flow paths to at least one of the dispensing openings such that at the branching points a portion of the paste is separated from the respective circulating region and via the dispensing openings is applied on the carrier substrate (5), and at each of the branching points a length of the flow path of the paste, starting from the branching point via the dispensing flow path to the dispensing opening is less than 5 cm, wherein the circulating region comprises a rotation circuit and the pump cooperates with the rotation circuit such that the paste in the rotation circuit can be circulated via the pump.

11. A device according to claim 10, wherein the pump cooperates with the circulating region such that the paste can be rotated in the circulating region.

12. A device according to claim 10, wherein at least in a section of the circulating region, several of the branching points are arranged successively in a direction of flow of the paste, each of said branching points is connected in a fluid conducting fashion via at least one of the dispensing flow paths to at least one of the dispensing openings.

13. A device according to claim 12, wherein between a first and a last one of the branching points, seen in the direction of flow, a minimum cross-sectional area of the circulating region is greater by at least a factor of 5 than a minimum cross-sectional area of all of the flow paths between the branching point and the dispensing opening allocated to said branching point.

14. A device according to claim 12, wherein in the branching points, arranged successively in the direction of flow in the circulating region, a length of the flow path of the paste reduces between the branching point and the discharge from the dispensing opening allocated to the branching point or a minimum cross-sectional opening between the branching point increases from the circulating region and the discharge from the dispensing opening in the direction of flow in the circulating region or both.

15. A device according to claim 10, wherein the pump is arranged upstream in reference to the plurality of the branching points and a throttle is arranged downstream of a last one of the branching points in the direction of flow for increasing a flow resistance of the paste.

16. A device according to claim 10, wherein in an area of the branching points one or more oscillation devices are arranged at the circulating region in order to cause the paste to oscillate.

17. A device according to claim 10, wherein at least in the area of the branching points the circulating region is embodied as a hollow body with several of the branching points embodied as openings.

18. A device according to claim 10, wherein a heating unit is provided in the circulating region to introduce heat into the paste circulated.

19. A device according to claim 10, further comprising at least a second pump, the pumps respectively cooperate with the circulating region, with the first pump being arranged in the circulating region upstream in reference to a first one of the branching points and the second pump in the circulating region downstream in reference to a last one of the branching points.

20. A device for the production of a metallic contact structure for electrically contacting a photovoltaic solar cell, comprising dispensing flow paths with dispensing openings for a paste comprising metallic particles and at least one pump to discharge the paste via the dispensing flow paths to the dispensing openings onto a surface of a carrier substrate, the pump cooperates with a circulating region such that the paste can be rotated in the circulating region via the pump, with the circulating region comprising a plurality of branching points, each of said branching points being connected in a fluid-conducting fashion via at least one of the dispensing flow paths to at least one of the dispensing openings such that at the branching points a portion of the paste is separated from the respective circulating region and via the dispensing openings is applied on the carrier substrate, and at each of the branching points a length of the flow path of the paste, starting from the branching point via the dispensing flow path to the dispensing opening is less than 5 cm, wherein the pump is configured to cooperate with the circulating region such that an oscillating paste movement is generated by the pump.

* * * * *